(12) United States Patent
Cheung et al.

(10) Patent No.: US 10,151,774 B2
(45) Date of Patent: Dec. 11, 2018

(54) ELECTRICAL CONTACT HAVING ELECTRICAL ISOLATED MEMBERS FOR CONTACTING AN ELECTRICAL COMPONENT

(71) Applicant: ASM TECHNOLOGY SINGAPORE PTE LTD, Singapore (SG)

(72) Inventors: Yu Sze Cheung, Kwai Chung (HK); Kai Fung Lau, North Point (HK)

(73) Assignee: ASM TECHNOLOGY SINGAPORE PTE LTD (SG)

( * ) Notice: Subject to any disclaimer, the term of this patent is extended or adjusted under 35 U.S.C. 154(b) by 279 days.

(21) Appl. No.: 14/735,405

(22) Filed: Jun. 10, 2015

(65) Prior Publication Data
US 2016/0363610 A1    Dec. 15, 2016

(51) Int. Cl.
*G01R 1/04* (2006.01)

(52) U.S. Cl.
CPC ............ *G01R 1/0408* (2013.01); *G01R 1/04* (2013.01)

(58) Field of Classification Search
CPC .............. G01R 1/06711; G01R 1/0458; G01R 1/07314; G01R 1/07342; G01R 31/2884; G01R 31/2886; G01R 1/0483; G01R 1/07357; G01R 1/0466; G01R 1/07378; G01R 31/2891; G01R 1/067; G01R 1/06705; G01R 1/0671; G01R 1/06716; G01R 1/0675; G01R 1/07392; G01R 1/06722; G01R 31/2856; G01R 31/2863; G01R 1/0408; G01R 1/0433; G01R 1/045; G01R 1/06733; G01R 1/06738; G01R 1/06744; G01R 1/06772; G01R 29/087; G01R 31/2853; G01R 29/0878;
(Continued)

(56) References Cited

U.S. PATENT DOCUMENTS 3,667,037 A * 5/1972 Kierce ............. G01R 19/16557
324/133
4,028,812 A * 6/1977 Fieberg ................. G01L 5/0038
33/556
(Continued)

FOREIGN PATENT DOCUMENTS

WO    WO 2011/141582 A1    11/2011

*Primary Examiner* — Vinh Nguyen
(74) *Attorney, Agent, or Firm* — Ostrolenk Faber LLP

(57) ABSTRACT

Disclosed are an electrical contact for contacting an electrical component, an apparatus for testing an electrical component and a method of assembling an apparatus comprising an electrical contact for testing an electrical component. The electrical contact comprises a first member longitudinally extending and having an end, said first member having a first longitudinal side and a second longitudinal side; a second member having a first segment extending longitudinally adjacent to the first longitudinal side of the first member, a second segment extending longitudinally adjacent to the second longitudinal side of the first member, and a third segment extending substantially transverse to the first member and located adjacent to the end of the first member, the third segment being provided to couple the first segment to the second segment; wherein a continuous channel is defined between the first member and the second member such that the first member and the second member are electrically isolated from each other.

17 Claims, 8 Drawing Sheets

(58) Field of Classification Search
CPC ...... G01R 31/26; H01R 12/57; H01R 12/727; H01R 43/0249; H01R 43/0256; H01R 43/0263; H01R 43/20; H01R 12/714; H01R 13/2407; H01R 4/48; H04N 1/00965; G01L 1/04
See application file for complete search history.

(56) References Cited

U.S. PATENT DOCUMENTS

| | | | | |
|---|---|---|---|---|
| 4,681,391 | A * | 7/1987 | Bouley | H05K 7/1038 439/444 |
| 5,184,065 | A * | 2/1993 | Chism | G01R 1/067 324/72.5 |
| 5,936,237 | A * | 8/1999 | van der Weide | B82Y 20/00 250/234 |
| 6,614,245 | B1 * | 9/2003 | Endo | G01R 1/04 324/754.02 |
| 7,256,593 | B2 * | 8/2007 | Treibergs | G01R 1/06722 324/754.05 |

* cited by examiner

ELECTRICAL CONTACT HAVING ELECTRICAL ISOLATED MEMBERS FOR CONTACTING AN ELECTRICAL COMPONENT

TECHNICAL FIELD

The present disclosure relates broadly to an electrical contact that is used for contacting an electrical component during testing thereof and an apparatus comprising the electrical contact for testing an electrical component.

BACKGROUND

In the manufacture of electronic/electrical components, it is typically needed to perform functional testing, such as Kelvin contact testing, on an electronic/electrical component to ensure that the device under test is in working condition and fulfils its specification.

An electrical component can be tested using a test apparatus, such as a contacting device, which typically comprises a mounting block for mounting the electrical component, and one or more electrical contacts such as contact fingers for contacting leads of the electrical component. To perform testing, the electrical component to be tested is positioned such that the leads of the electrical component establish electrical contact with the contact fingers of the contacting device.

Typically, two separate contact strips are provided in an electrical contact of the testing apparatus to contact one lead of the electrical component being tested in order to perform a Kelvin contact test. One contact strip is configured to provide a test signal while the other contact strip is configured to sense/receive signals. The contact strips are coupled to a processor unit which implements a test program and analyses the signals to obtain results of the test.

In order to achieve sufficient electrical contact, the lead of the electrical component should be positioned or to sit on both of the contact strips.

However, one problem that may arise is that due to the high speeds at which testing of multiple electrical components are carried out, an electrical component may be positionally offset such that a lead of the electrical component may be unable to maintain contact with both contact strips during testing. This may induce a Kelvin contact test failure and thus lower the overall test yield/productivity of the test apparatus.

Difficulties in proper positioning of the electrical components are further compounded by physical variations between electrical components. For example, mould offset may occur during the manufacturing stage, causing electrical components within a same batch to have slight physical variations and therefore, may not contact the electrical contacts of the test apparatus consistently.

To increase tolerance to positional offsets, it has been proposed that the contact strips be configured to include a L-shaped strip along one side of a straight strip. However, as discussed in WO 2011/141582A1, such a configuration is still not capable of establishing reliable electrical connection. For example, an electric component may be positionally offset such that a lead of the electric component sits on the opposite side of the straight strip from the L-shaped strip and not contacting the L-shaped contact strip.

To overcome the challenges associated with two separate contact strips, improvements have been proposed, such as to employ three or more separate contact strips per electrical contact to further increase the tolerance of the positional offsetting of electrical components. WO 2011/141582A1 discloses three contact strips being sequentially positioned such that at least two of the three contact strips establish an electrical connection with a lead of an electrical component. However, it has been recognised by the inventors that such an improvement increases fabrication cost and complexity due to the requirement for more strands of contact strips. The complexity also arises from fabrication and arrangement of three contact strips in relation to one another for each contact point and also the electrical wiring from various contact strips to the processor unit.

Thus, there exists a need for an electrical contact for contacting an electrical component that seek to address at least one of the above problems.

SUMMARY

A first aspect of the present disclosure is an electrical contact for contacting an electrical component. The electrical contact comprises a first member longitudinally extending and having an end, said first member having a first longitudinal side and a second longitudinal side; a second member having a first segment extending longitudinally adjacent to the first longitudinal side of the first member, a second segment extending longitudinally adjacent to the second longitudinal side of the first member, and a third segment extending substantially transverse to the first member and located adjacent to the end of the first member, the third segment being provided to couple the first segment to the second segment; wherein a continuous channel is defined between the first member and the second member such that the first member and the second member are electrically isolated from each other.

A second aspect of the present disclosure is an apparatus for testing an electrical component. The apparatus comprises at least one electrical contact for contacting the electrical component, the electrical contact comprising a first member longitudinally extending and having an end, said first member having a first longitudinal side and a second longitudinal side; a second member having a first segment extending longitudinally adjacent to the first longitudinal side of the first member, a second segment extending longitudinally adjacent to the second longitudinal side of the first member, and a third segment extending substantially transverse to the first member and located adjacent to the end of the first member, the third segment being provided to couple the first segment to the second segment; wherein a continuous channel is defined between the first member and the second member such that the first member and the second member are electrically isolated from each other.

A third aspect of the present disclosure is a method of assembling an apparatus for testing an electrical component. The method comprises providing a holder and providing at least one electrical contact for contacting the electrical component. The electrical contact comprises a first member longitudinally extending and having an end, said first member having a first longitudinal side and a second longitudinal side, the first member being supported by a first support strip to facilitate fixation by the holder; a second member being supported by a second support strip to facilitate fixation by the holder, the second member further having a first segment extending longitudinally adjacent to the first longitudinal side of the first member, a second segment extending longitudinally adjacent to the second longitudinal side of the first member, and a third segment extending substantially transverse to the first member and located adjacent to the end of the first member, the third segment being provided to couple the first segment to the second segment; and a continuous channel defined between the first member and the second member such that the first member and the second member are electrically isolated from each other. The method further comprises fixedly securing the first and second support strips relative to each other by fastening end portions of the first and second support strips with the holder.

BRIEF DESCRIPTION OF THE DRAWINGS

Exemplary embodiments of the invention will be better understood and readily apparent to one of ordinary skill in the art from the following written description, by way of example only, and in conjunction with the drawings, in which.

DETAILED DESCRIPTION

Exemplary, non-limiting embodiments may provide an electrical contact and a test apparatus for testing electrical components.

Figure 1:
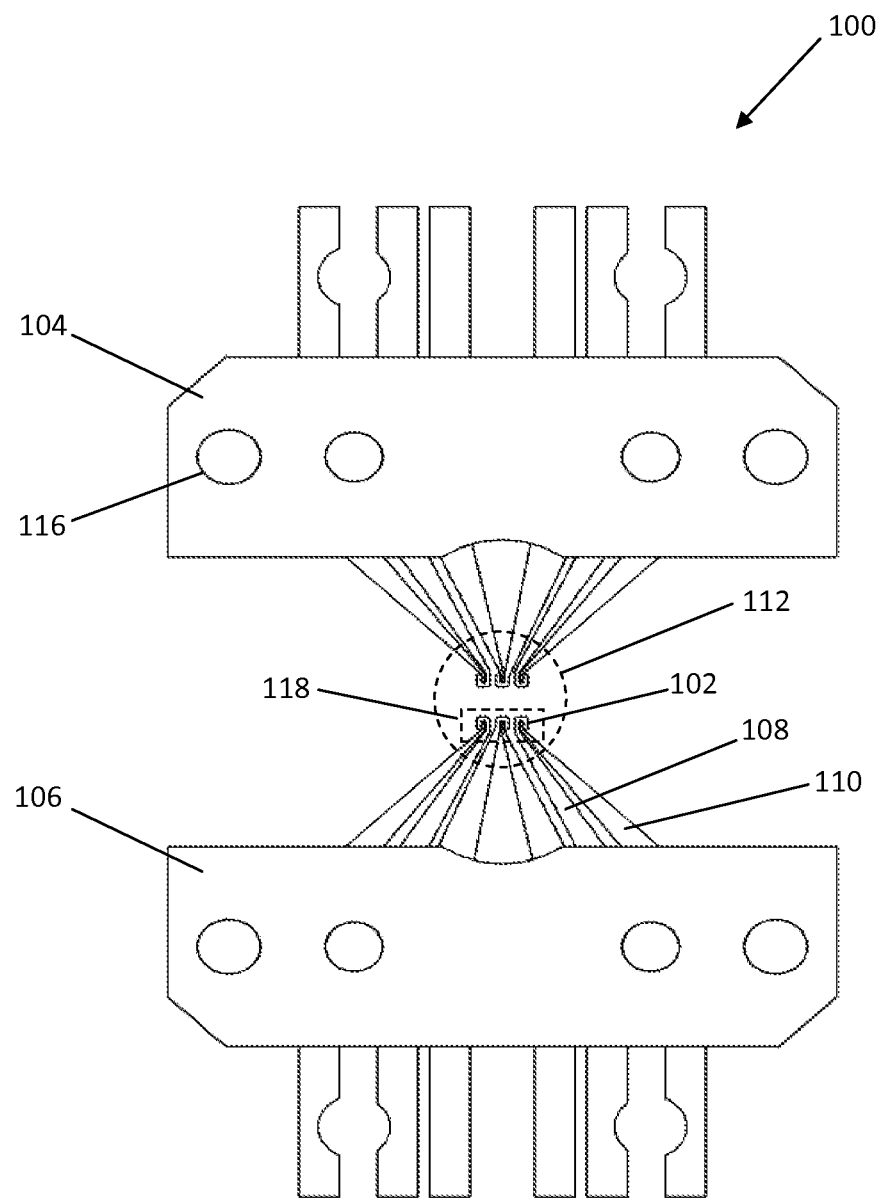
FIG. 1 is a top view of a test assembly in an exemplary embodiment.

FIG. 1 is a top view of a test assembly 100 in an exemplary embodiment. The test assembly 100 forms part of a test apparatus and functions to receive an electrical component (not shown) for testing. The test assembly 100 may communicate with a processor unit (not shown) of the testing apparatus to provide results of a test. The test assembly 100 comprises electrical contacts 102 and holders 104, 106 to maintain the electrical contacts 102 in a fixed position. Each electrical contact 102 comprises two contact strips 108, 110 to contact a lead of an electrical component. The placement region 112 (shown in dotted profile) may accommodate an electrical component such that the leads of the electrical component contact the electrical contacts 102. Fastening members which include apertures 116 are provided for securing each holder 104, 106 to a surface of the test apparatus. The apertures may receive pins or screws to align and fasten each holder 104, 106 to the test apparatus.

Figure 2:
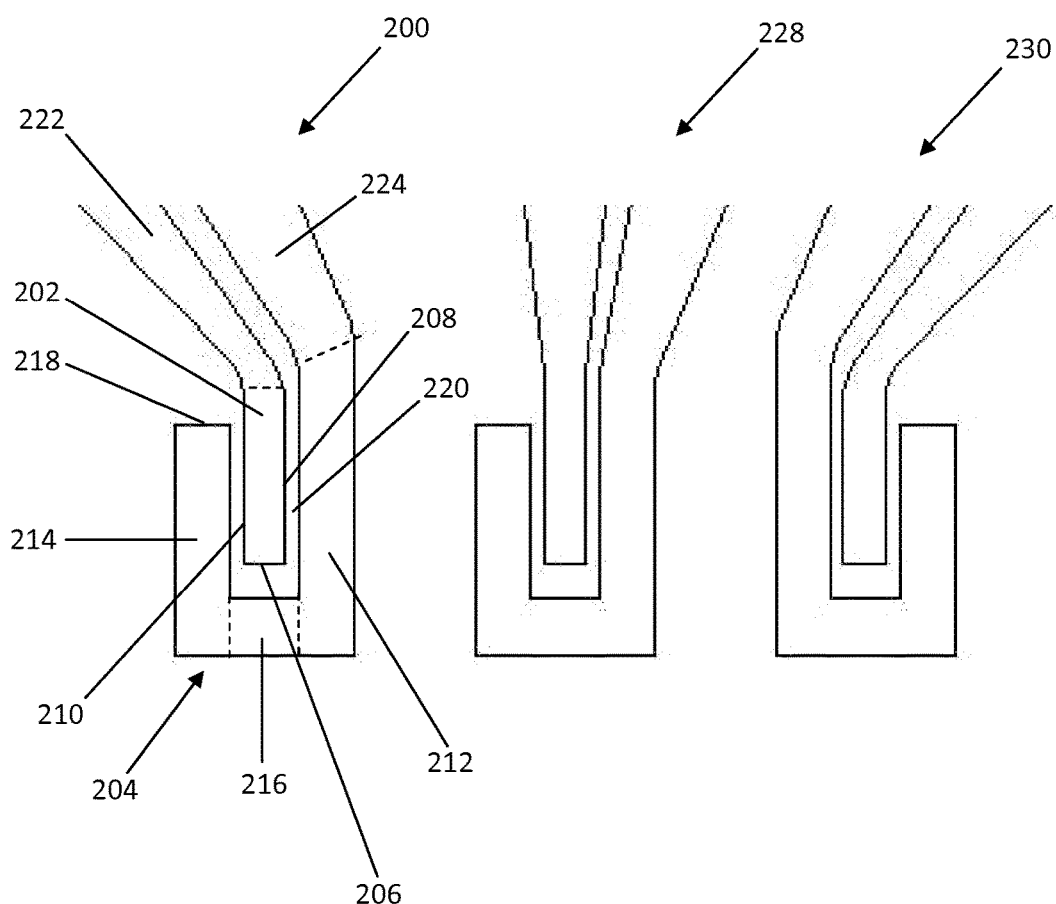
FIG. 2 is an enlarged top view of the electrical contacts located within the dotted profile shown in FIG. 1.

FIG. 2 is an enlarged top view of the electrical contacts located within the dotted profile 118 shown in FIG. 1. For ease of understanding, only one electrical contact 200 is described. It will be appreciated that the three electrical contacts shown are substantially similar in function and construction. FIG. 2 also shows that the electrical contacts may be orientated differently (compare contacts 200 and 230).

The electrical contact 200 comprises a longitudinally-extending first member 202 and a second member 204 adjacent to the first member 202. The first member 202 terminates at an end 206. The first member 202 is defined by a first longitudinal side 208 and a second longitudinal side 210 disposed on opposite sides of the first member 202.

The second member 204 comprises a first segment 212 (outlined in dotted profile) extending longitudinally adjacent to the first longitudinal side 208 of the first member 202.

The second member 204 also comprises a second segment 214 (also outlined in dotted profile) extending longitudinally adjacent to the second longitudinal side 210 of the first member 202. A third segment 216 is provided to connect the first segment 212 and the second segment 214 of the second member 204. The third segment 216 is provided extending substantially transverse to the first member 202 and located adjacent to the end 206 of the first member 202. The second member 204 terminates at one end 218 of the second segment 214. In the exemplary embodiment, the end 218 of the second member 204 is adjacent to the second longitudinal side 210 of the first member 202.

A continuous channel 220 is defined by the space between the first member 202 and the second member 204 so that the first member 202 and the second member 204 are electrically isolated from each other. In the exemplary embodiment, the three separate electrical contacts 200, 228, 230 are also electrically isolated from one another.

It should be appreciated that although the second member 204 is illustrated as being parallel to the first member, the exemplary embodiment is not limited as such as long as the first and second segments are adjacent to each other and the second member 204 is electrically isolated from the first member 202.

As shown in FIG. 2, each electrical contact 200 comprises a straight blade which comprises the first member 202, and a "U-shaped" blade which comprises the second member 204. In the exemplary embodiment, the arrangement of the first member 202 and the second member 204 has increased tolerance to positional offsets to facilitate establishment of electrical connection with a lead of an electrical component.

The first member 202 and the second member 204 each broadens in width into broad segments in the form of support strips 222 and 224 to facilitate fixation by the holder 104. The holder 104 is provided to secure the first member 202 and the second member 204 at their respective support strips 222, 224 in relatively fixed positions.

Figure 3A:
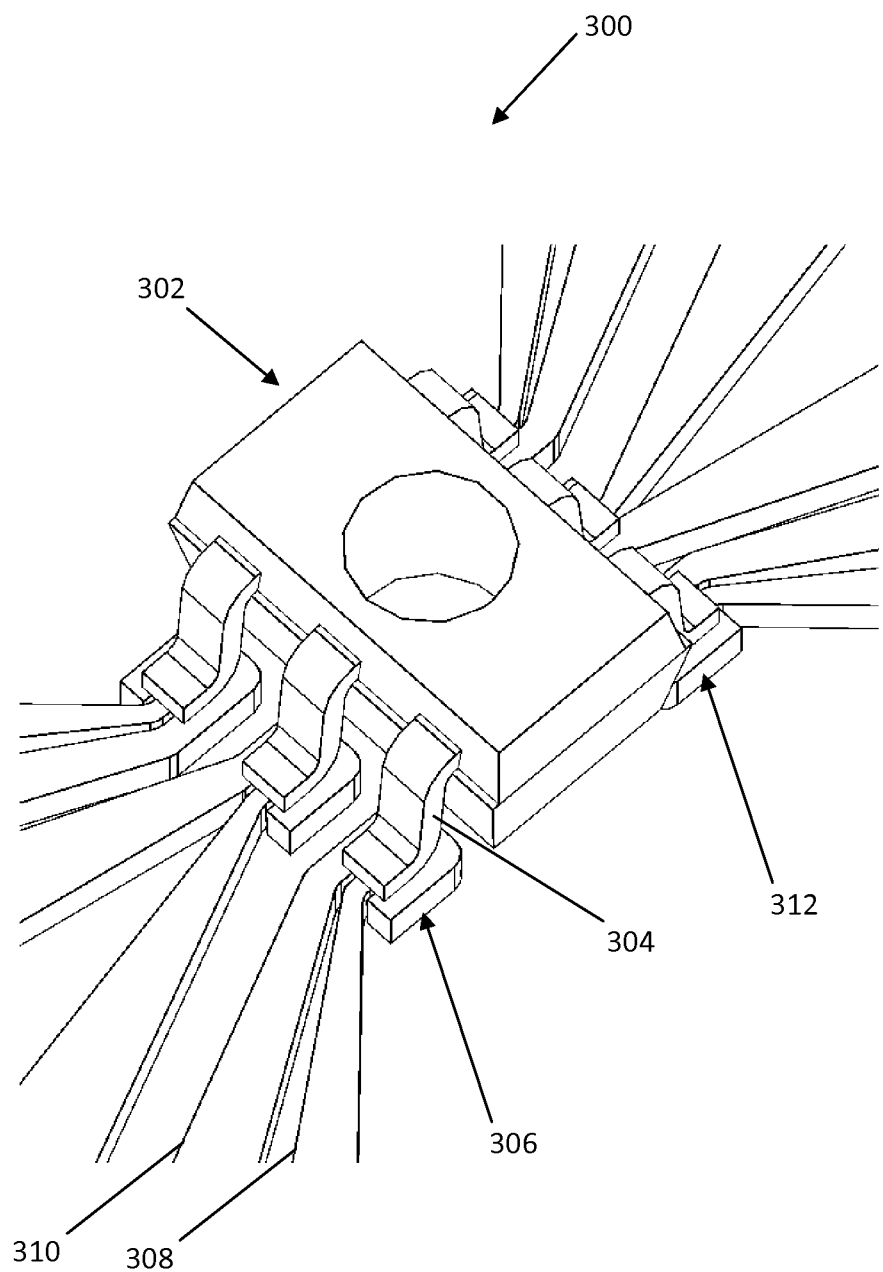
FIG. 3(a) is a perspective view of an electrical component positioned in a test assembly in an exemplary embodiment.
Figure 3B:
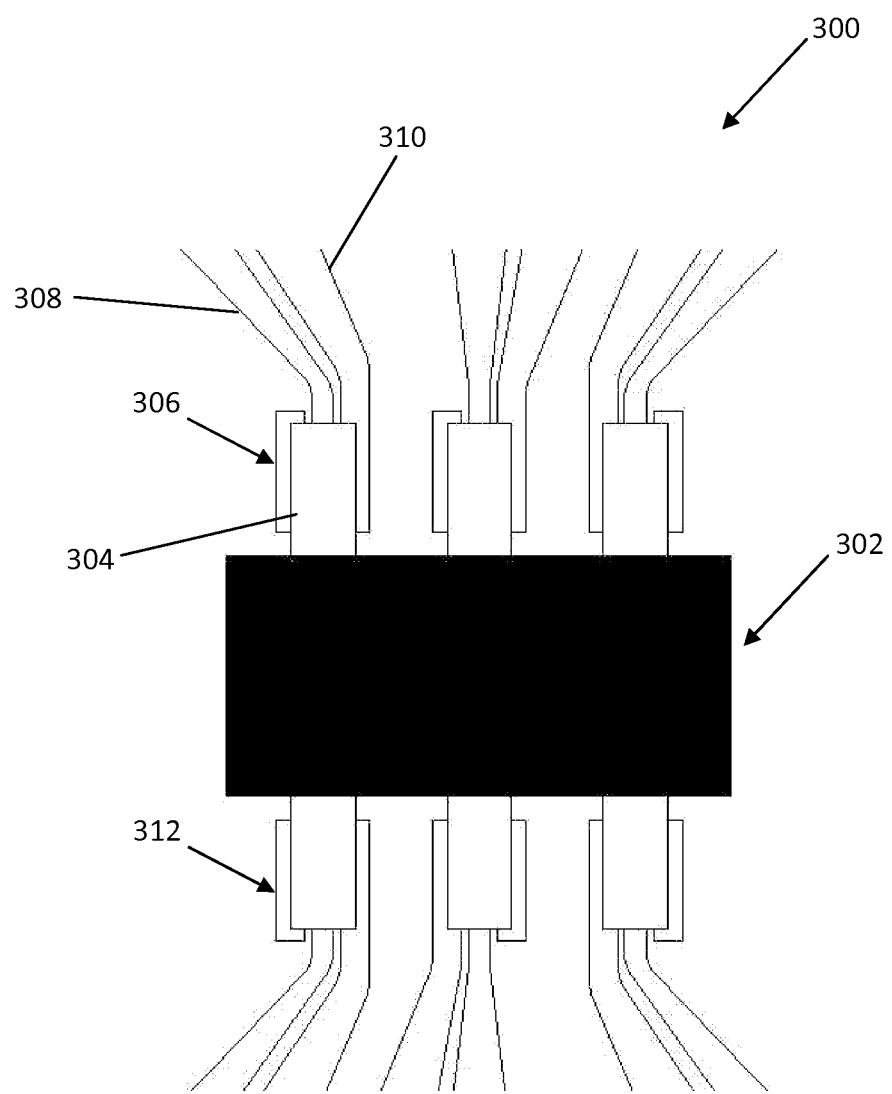
FIG. 3(b) is a top view of the electrical component positioned in the test assembly.

FIG. 3(a) is a perspective view of an electrical component 302 positioned in a test assembly 300 in an exemplary embodiment. FIG. 3(b) is a top view of the electrical component 302 positioned in the test assembly 300. The electrical component 302 comprises six leads 304, each of which makes contact with a respective electrical contact 306, 312 of the test assembly 300. Each electrical contact is substantially identical to the electrical contacts 200, 228, 300 described with reference to FIG. 2. The electrical contacts 306, 312 function to establish electrical connections with respective electrical leads 304 of an electrical component 302 for testing. At each electrical contact 306, 312, each of the first member and the second member broadens in width to form support strips 308, 310 for facilitating fixation of the electrical contacts 306, 312.

The first and second members of each electrical contact 306, 312 comprise planar surfaces to maximise contact surface areas with each lead 304 of the electrical component 302, thus facilitating and improving the electrical connections between the test assembly 300 and the electrical component 302. The first and second members of each electrical contact 306, 312 are also configured to be coplanar. That is, the planar surfaces of the first member and the second member lie substantially in the same plane. This ensures that each lead 304 of the electrical component 302 is positionable to be in contact with both the first and second members when conducting tests.

In the exemplary embodiment, the electrical component 302 is shown to be positioned in a testing location. That is, the electrical component 302 is appropriately positioned such that each lead 304 is positioned substantially centrally on the corresponding electrical contact.

The operation or use of the test assembly will now be described.

In operation, a pick head (not shown) carrying the electrical component 302 aligns the electrical component 302 in a pre-defined orientation above the test assembly 300. The pick head subsequently pushes the electrical component 302 downwards onto the test assembly 300 such that the leads 304 of the electrical component 302 contact the electrical contacts 306, 312 of the test assembly 300. The electrical component 302 is then subjected to testing, for instance Kelvin contact testing.

To perform testing, one of the support strips 308 of the electrical contact 306 connected to the first member is configured to transmit a test signal to the lead 304. Another support strip 310 connected to the second member is configured to detect a return signal from the lead 304 to determine if the electrical component 302 has transmitted and/or modified the test signal in accordance with the test requirement. The signals are sent from and transmitted to a processor unit (not shown) which analyses the signals based on the parameters and requirements of the test.

The performance of the electrical component 302 is determined by the processor unit. Based on the performance of the electrical component 302, it can be determined whether the electrical component 302 is faulty or not. Depending on the outcome of the test, the electrical component 302 is raised and transported to another location for further processing.

With the aforesaid arrangement of the first member and the second member of the electrical contact 306, 312, an increased tolerance to positional offsets of the electrical component 302 is achieved. Some examples are described below.

Figure 4A:
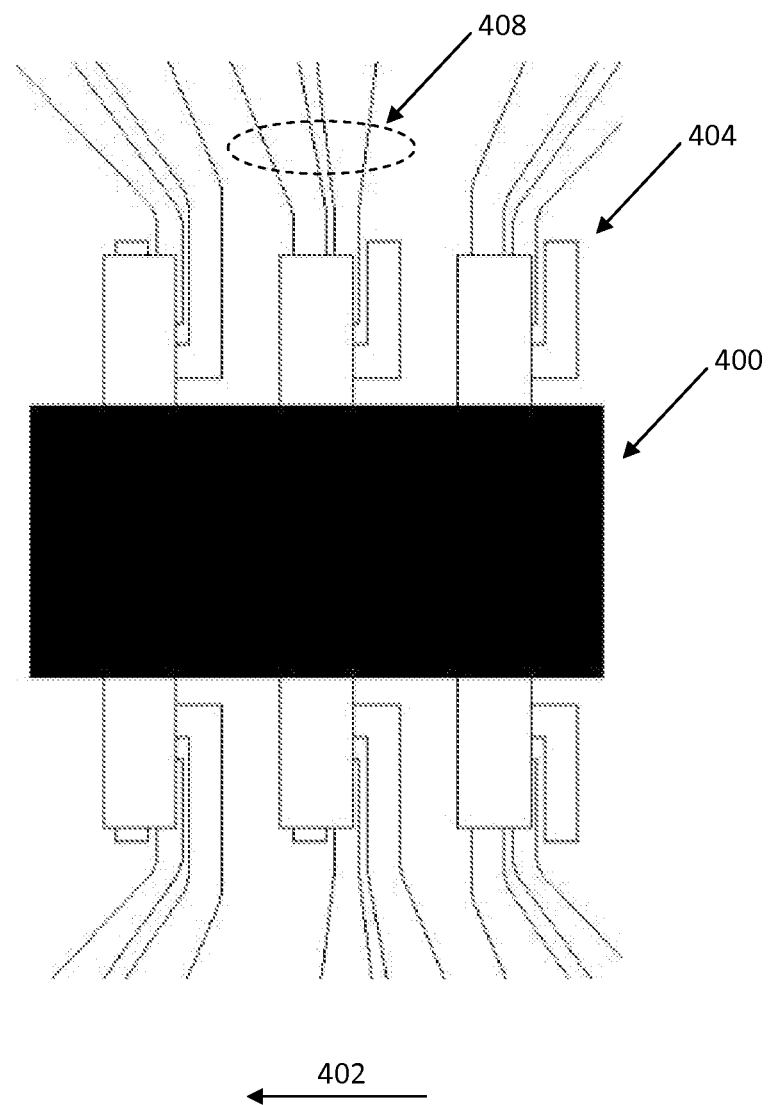
FIG. 4(a) is a top view of an electrical component which is positionally offset along a first direction relative to a test assembly in an exemplary embodiment.
Figure 4B:
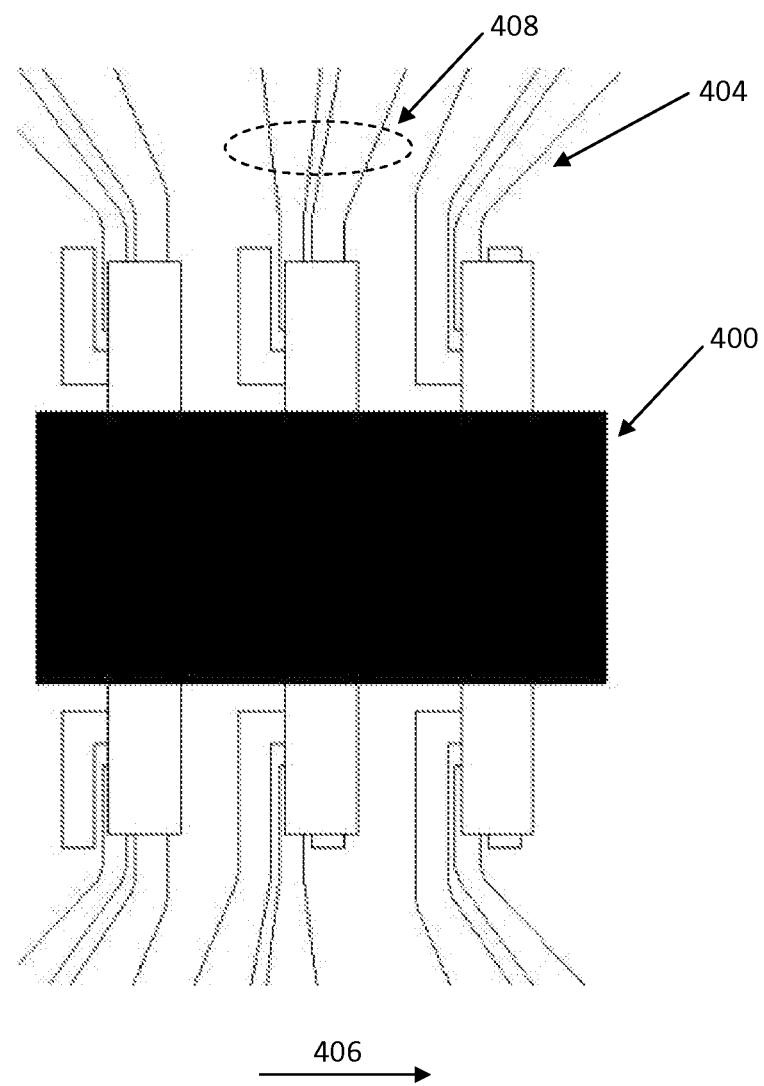
FIG. 4(b) is a top view of the electrical component which is positionally offset along a second direction relative to a test assembly in the exemplary embodiment.
Figure 4C:
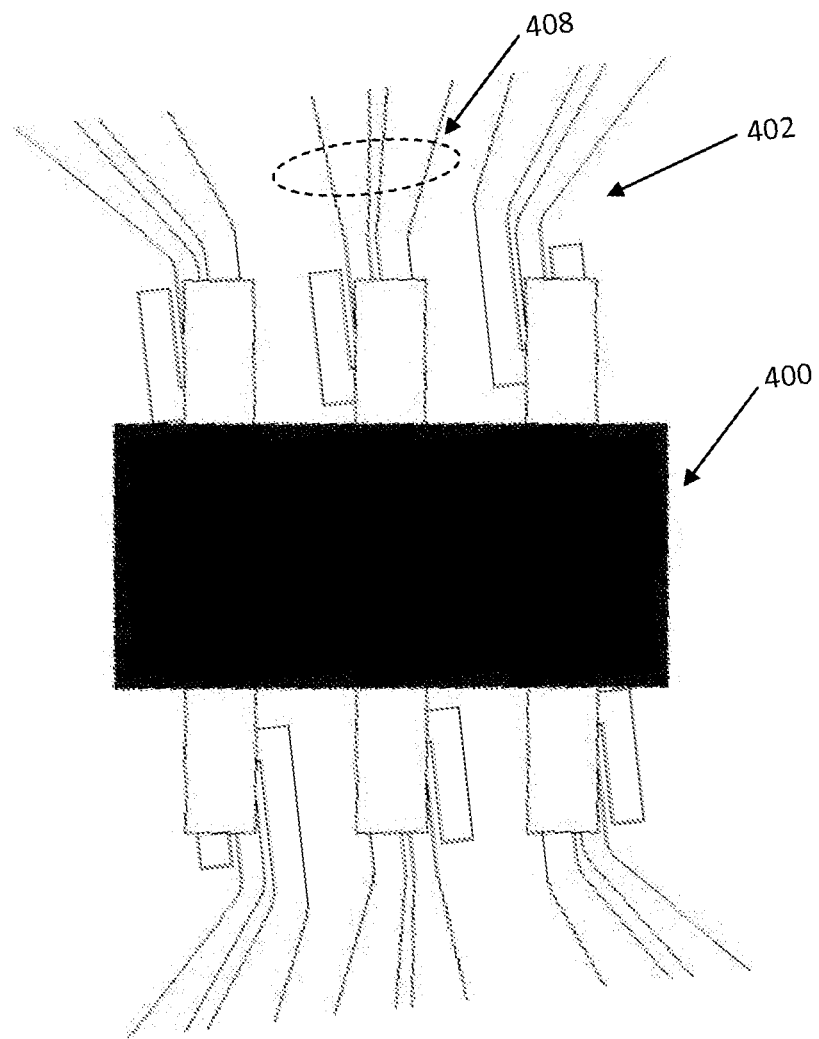
FIG. 4(c) is a top view of the electrical component which is rotationally offset relative to a test assembly in the exemplary embodiment.

FIG. 4(a) to FIG. 4(c) each illustrates a positional offset that an electrical component may exhibit when positioned on a test assembly. FIGS. 4(a) and 4(b) show translational position offsets while FIG. 4(c) show a rotational position offset.

FIG. 4(a) is a top view of an electrical component 400 which is positionally offset along a first direction 402 relative to a test assembly 404 in an exemplary embodiment. Advantageously, with the aforesaid configuration of the first member and the second member of the electrical contact, the leads of the electrical component 400 are still in proper electrical connection with the electrical contacts 408, i.e. contacting both the first and second members of the electrical contact.

FIG. 4(b) is a top view of the electrical component 400 which is positionally offset along a second direction 406 relative to a test assembly 404 in the exemplary embodiment. Advantageously, with the aforesaid configuration of the first member and the second member of the electrical contact, the leads of the electrical component 400 are still in proper electrical connection with the electrical contacts 408, i.e. contacting both the first and second members of the electrical contact.

FIG. 4(c) is a top view of the electrical component 400 which is rotationally offset relative to a test assembly 404 in the exemplary embodiment. With the aforesaid configuration of the first member and the second member of the electrical contact, advantageously, the leads of the electrical component 400 are still in proper electrical connection with the electrical contacts 408, i.e. contacting both the first and second members of the electrical contact.

The examples shown in FIGS. 4(a) to (c) demonstrate that even when the electrical component is translationally or rotationally offset, the electrical contacts 408 of the test assembly 404 may maintain sufficient electrical contact with the leads of the electrical component 400 in order to conduct testing. In other words, both support strips of each electrical contact 408 still maintains contact with the corresponding lead of the electrical component 400.

Figure 5:
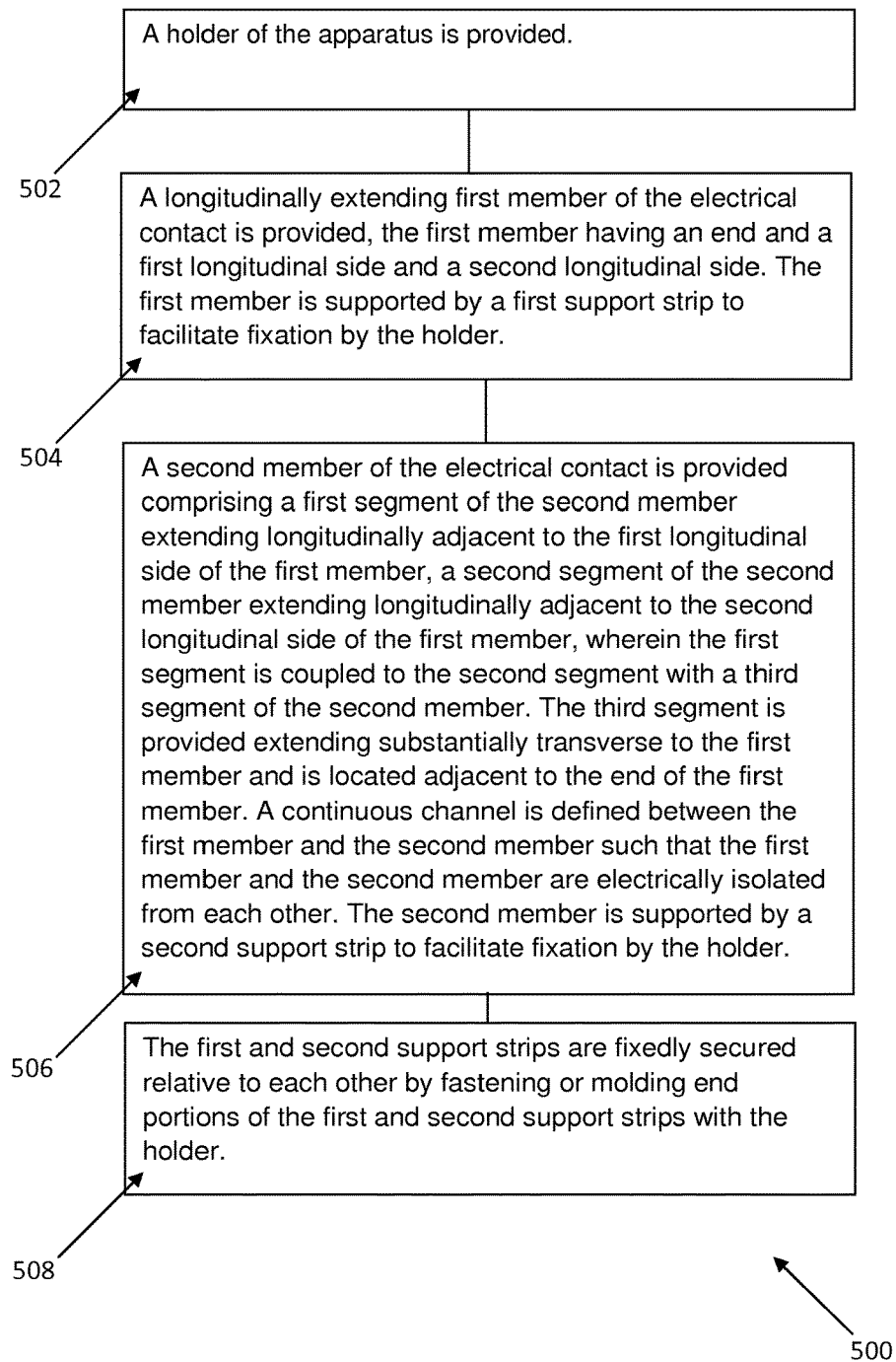
FIG. 5 is a flowchart which illustrates a method of assembling an apparatus comprising an electrical contact for testing an electrical component in an exemplary embodiment.

FIG. 5 is a schematic flowchart 500 which illustrates a method of assembling an apparatus comprising an electrical contact for testing an electrical component in an exemplary embodiment. At step 502, a holder of the apparatus is provided. At step 504, a longitudinally extending first member of the electrical contact is provided, the first member having an end and a first longitudinal side and a second longitudinal side. The first member is supported by a first support strip to facilitate fixation by the holder. At step 506, a second member of the electrical contact is provided comprising a first segment of the second member extending longitudinally adjacent to the first longitudinal side of the first member, a second segment of the second member extending longitudinally adjacent to the second longitudinal side of the first member, wherein the first segment is coupled to the second segment with a third segment of the second member. The third segment is provided extending substantially transverse to the first member and is located adjacent to the end of the first member. A continuous channel is defined between the first member and the second member such that the first member and the second member are electrically isolated from each other. The second member is supported by a second support strip to facilitate fixation by the holder. At step 508, the first and second support strips are fixedly secured relative to each other by fastening or molding end portions of the first and second support strips with the holder.

In the exemplary embodiment, an end of the second member terminates at the second segment, the end being adjacent the second longitudinal side of the first member.

The contact strips and test assembly described in the exemplary embodiments herein can be used in testing apparatus for high speed electronic/electrical component testing. In industrial production, electrical components which are inherently functional may be rejected at the testing stage due to poor electrical connections caused by misalignment/positional offset during mounting onto a testing apparatus. One advantage of the electrical contacts described is that the specific configuration of the contact strips provides increased tolerance to any offset or misalignment of electronic/electrical component during electrical contact testing. This is achieved by modifying the shape of the contact strips without increasing the number of contact strips and therefore, avoiding significant fabrication costs and complexity. Accordingly, the use of the electrical contact described herein reduces the occurrence of test failure, such as Kelvin contact test failure due to poor electrical connections and thus improves the overall test yield. This, in turn, improves the overall productivity of the testing apparatus.

In the described exemplary embodiments, the test assembly and test apparatus have been described for use in testing electrical components. However, it is appreciated that the test assembly and test apparatus may also be used for testing other types of components which conduct electricity.

In the described exemplary embodiments, the electrical component which can be mounted on the test assembly has been described to have six leads. However, it is appreciated that the electrical component may have more than, or less, than six leads. The leads may also be equally or unequally distributed on each side of the electrical component. Similarly, the described test assembly may be configured to have a varying number of electrical contacts, depending on the electrical component to be tested, and also depending on the position of leads on the electrical component to be tested.

Further, with reference to FIGS. 1 and 2, the electrical contacts 102 are arranged to converge at a placement region and are spaced apart at a predefined distance and orientation to coincide with the position of the leads of an electrical component. It would be appreciated that the exemplary embodiments are not limited as such and may have other forms of displacement and orientation.

It will be appreciated by a person skilled in the art that other variations and/or modifications may be made to the specific embodiments without departing from the scope of the invention as broadly described. The present embodiments are, therefore, to be considered in all respects to be illustrative and not restrictive.

The invention claimed is:

1. An electrical contact for conductively receiving a lead of an electrical component, the electrical contact comprising:
   first and second members configured and dimensioned to provide a substantially planar surface for receiving a corresponding substantially planar surface of said lead of the electrical component on both of said first and second members;
   the first member longitudinally extending and having an end, a first longitudinal side, and a second longitudinal side opposite to the first longitudinal side;
   the second member having
      a first segment extending longitudinally adjacent to the first longitudinal side of the first member,
      a second segment extending longitudinally adjacent to the second longitudinal side of the first member, and
      a third segment extending substantially transverse to the first member and located adjacent to the end of the first member, the third segment being provided to couple the first segment to the second segment;
   wherein a continuous channel is defined between the first member and the second member such that the first member and the second member are electrically isolated from each other.

2. The electrical contact according to claim 1, wherein the second member terminates at an end at the second segment, said end of the second member being adjacent to the second longitudinal side of the first member.

3. The electrical contact according to claim 1, wherein the first and second segments of the second member are substantially parallel to the first member.

4. The electrical contact according to claim 1, wherein one of the first member and the second member is configured to supply a signal to the electrical component and the other one of the first member and the second member is configured to detect a signal from the electrical component.

5. The electrical contact according to claim 1, wherein said first, second and third segments together define a U-shape of said second member, thereby defining a continuous U-shaped channel between the first member and the second member.

6. The electrical contact according to claim 1, wherein said lead of the electrical component is received simultaneously on both of said first and second members.

7. An apparatus for testing an electrical component, said apparatus comprising
   at least one electrical contact for conductively receiving a lead of the electrical component, the electrical contact comprising:
      first and second members configured and dimensioned to provide a substantially planar surface for receiving a corresponding substantially planar surface of said lead of the electrical component on both of said first and second members;
      the first member longitudinally extending and having an end, said first member having a first longitudinal side, and a second longitudinal side opposite to the first longitudinal side;
      the second member having
         a first segment extending longitudinally adjacent to the first longitudinal side of the first member,
         a second segment extending longitudinally adjacent to the second longitudinal side of the first member, and
         a third segment extending substantially transverse to the first member and located adjacent to the end of the first member, the third segment being provided to couple the first segment to the second segment;
      wherein a continuous channel is defined between the first member and the second member such that the first member and the second member are electrically isolated from each other.

8. The apparatus according to claim 7, wherein the second member terminates at an end at the second segment, said end of the second member being adjacent to the second longitudinal side of the first member.

9. The apparatus according to claim 7, further comprising a holder for maintaining the first member and the second member of the at least one electrical contact in a fixed position.

10. The apparatus according to claim 7, wherein the first and second segments of the second member are substantially parallel to the first member.

11. The apparatus according to claim 7, wherein one of the first member and the second member is configured to supply a signal to the electrical component and the other one of the first member and the second member is configured to detect a signal from the electrical component.

12. The apparatus according to claim 7, wherein said first, second and third segments together define a U-shape of said second member, thereby defining a continuous U-shaped channel between the first member and the second member.

13. The apparatus according to claim 7, wherein said lead of the electrical component is received simultaneously on both of said first and second members.

14. A method of assembling an apparatus for testing an electrical component, said method comprising
   providing a holder;
   providing at least one electrical contact for conductively receiving a lead of the electrical component, the electrical contact comprising:
      first and second members configured and dimensioned to provide a substantially planar surface for receiving a corresponding substantially planar surface of said lead of the electrical component on both of said first and second members;

the first member longitudinally extending and having an end, said first member having a first longitudinal side, and a second longitudinal side opposite to the first longitudinal side;

the first member being supported by a first support strip to facilitate fixation by the holder;

the second member being supported by a second support strip to facilitate fixation by the holder, the second member further having
- a first segment extending longitudinally adjacent to the first longitudinal side of the first member,
- a second segment extending longitudinally adjacent to the second longitudinal side of the first member, and
- a third segment extending substantially transverse to the first member and located adjacent to the end of the first member, the third segment being provided to couple the first segment to the second segment; and a continuous channel defined between the first member and the second member such that the first member and the second member are electrically isolated from each other; and fixedly securing the first and second support strips relative to each other by fastening end portions of the first and second support strips with the holder.

15. The method according to claim 14, wherein the first and second segments of the second member are fixedly secured substantially parallel to the first member.

16. The method according to claim 14, wherein said first, second and third segments together define a U-shape of said second member, thereby defining a continuous U-shaped channel between the first member and the second member.

17. The method according to claim 14, wherein said lead of the electrical component is received simultaneously on both of said first and second members.

* * * * *